(12) United States Patent
Ono et al.

(10) Patent No.: US 8,765,492 B2
(45) Date of Patent: Jul. 1, 2014

(54) SILICON WAFER AND METHOD OF MANUFACTURING SAME

(75) Inventors: Toshiaki Ono, Tokyo (JP); Takayuki Kihara, Tokyo (JP); Yumi Hoshino, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 13/258,702

(22) PCT Filed: Mar. 24, 2010

(86) PCT No.: PCT/JP2010/002060
§ 371 (c)(1),
(2), (4) Date: Sep. 22, 2011

(87) PCT Pub. No.: WO2010/109853
PCT Pub. Date: Sep. 30, 2010

(65) Prior Publication Data
US 2012/0012983 A1    Jan. 19, 2012

(30) Foreign Application Priority Data

Mar. 25, 2009 (JP) ................................. 2009-074947

(51) Int. Cl.
| | | |
|---|---|---|
| H01L 21/66 | (2006.01) | |
| H01L 21/302 | (2006.01) | |
| H01L 29/36 | (2006.01) | |
| H01L 21/324 | (2006.01) | |
| C30B 29/06 | (2006.01) | |
| C30B 33/02 | (2006.01) | |
| H01L 29/78 | (2006.01) | |

(52) U.S. Cl.
CPC ............... C30B 33/02 (2013.01); H01L 29/36 (2013.01); *H01L 29/7833* (2013.01); H01L 21/324 (2013.01); C30B 29/06 (2013.01)
USPC .................... 438/7; 438/16; 438/754; 438/14

(58) Field of Classification Search
USPC ...................... 117/97, 94, 105; 257/E21.318, 257/E21.521; 438/473, 7, 16
See application file for complete search history.

(56) References Cited

U.S. PATENT DOCUMENTS 5,681,396 A * 10/1997 Madanshetty ................. 134/1.3
7,828,893 B2 * 11/2010 Mueller et al. .................... 117/3
(Continued)

FOREIGN PATENT DOCUMENTS

| JP | 2000-323486 | 11/2000 |
|---|---|---|
| JP | 2004-319642 | 11/2004 |

(Continued)

OTHER PUBLICATIONS

Search report from International Application No. PCT/JP2010/002060, mail date is Apr. 20, 2010.

(Continued)

*Primary Examiner* — David Vu
*Assistant Examiner* — Mouloucoulaye Inoussa
(74) *Attorney, Agent, or Firm* — Greenblum & Bernstein, P.L.C.

(57) ABSTRACT

This method of manufacturing a silicon wafer has a step of preparing a wafer, in which a surface of the silicon wafer is surface-treated, a step of setting stress, in which the stress S (MPa) subjected on the wafer is set, a step of inspecting, in which a defect on a surface of the wafer is inspected, and a step of determining, in which the wafer is evaluated if the wafer satisfies a criterion. In this method, it is possible to manufacture a wafer with cracking resistance even if it is subjected to a millisecond annealing by the FLA annealing treatment.

8 Claims, 6 Drawing Sheets

(56) References Cited

U.S. PATENT DOCUMENTS

| | | | |
|---|---|---|---|
| 7,936,051 B2* | 5/2011 | Ono et al. | 257/655 |
| 2007/0169688 A1* | 7/2007 | Yoon et al. | 117/94 |
| 2009/0242843 A1* | 10/2009 | Ebara | 252/500 |
| 2009/0256241 A1* | 10/2009 | Kurita et al. | 257/617 |
| 2011/0151592 A1* | 6/2011 | Libbert et al. | 438/7 |

FOREIGN PATENT DOCUMENTS

| | | |
|---|---|---|
| JP | 2008-098640 | 4/2008 |
| JP | 2008-515200 | 5/2008 |
| JP | 2008-306206 | 12/2008 |
| JP | 2009-23851 | 2/2009 |
| KR | 10-2007-0048183 | 5/2007 |
| WO | 2004/008521 | 1/2004 |
| WO | 2006/003812 | 1/2006 |
| WO | 2006/036869 | 4/2006 |

OTHER PUBLICATIONS

Korean Office action in counterpart application No. 10-2011-7022890, dated Apr. 19, 2013 along with an English-language translation thereof.

Japanese Office action in counterpart application No. 2009-74947, dated May 21, 2013 along with an English-language translation thereof.

Taiwanese Office Action in counterpart Taiwanese application No. 099108918, dated Nov. 20, 2012, with English-language translation.

Zbignew H. Stachurski, "Testing Materials' Hardness Science, Technology & Application," Materials Forum vol. 30-2006. pp. 118-125.

* cited by examiner

SILICON WAFER AND METHOD OF MANUFACTURING SAME

TECHNICAL FIELD

The present invention relates to a silicon wafer and a method of manufacturing the same, and more particularly, to a technique suitable for use in a silicon wafer subjected to heat treatment in which high internal stress is generated.

Priority is claimed on Japanese Patent Application No. 2009-074947, filed Mar. 25, 2009, the content of which is incorporated herein by reference.

BACKGROUND ART

Because of higher degree of integration of devices, a rapid heating and cooling process is heavily used in a device manufacturing process. Time period for the process is shorter, and the maximum temperature of the process is higher. Particularly, in a 45 nm node (hp65) and after, the FLA (Flash Lamp Annealing), LSA (Laser Spike Annealing), or LTP (Laser Thermal Process) can be chosen as an annealing process.

Among these, in the FLA heat treatment, a wafer is heated to an initial temperature of 400° C. to 600° C., and only a surface of the wafer is rapidly heated to a temperature from 1100° C. to a silicon melting point by irradiating an entire surface of the wafer with a short wavelength light, for example, from a Xe lamp, and then rapidly cooled. A heat treatment time is in units (on the order) of μ second to m second.

A technique related to the FLA process is disclosed in the following documents.

RELATED ART DOCUMENT

Patent Literature

[Patent Literature 1] Published Japanese Translation No. 2008-515200 of the PCT International Publication
[Patent Literature 2] Japanese Unexamined Patent Application, First Publication No. 2008-98640

In such a heat treatment, a temperature difference of several hundred ° C. is generated between the front and back surfaces of a wafer. Therefore, an extremely high stress is applied to the wafer compared to the case that the conventional RTA (Rapid Thermal Annealing) is performed.

DISCLOSURE OF INVENTION

Technical Problem

Since the extremely high stress is applied to the wafer in the recent rapid heating and cooling process as described above, the wafer easily cracks in millisecond annealing, such as the above-described FLA. Also, as described in the paragraph [0042] of Patent Literature (PTL) 2, the heat treatment higher than 700° C. is avoided in a process after the FLA in order to suppress diffusion of impurities. As exemplified above, there are plenty of restrictions on the treatment condition in the device manufacturing process. As a result, there is a demand to solve the problem in the silicon wafer before the device manufacturing process.

The present invention has been achieved in view of the foregoing circumstances, and an object of the present invention is to provide a wafer having cracking resistance even if it is subjected to a millisecond annealing by the FLA annealing treatment.

Solution to Problem

The inventors of the present invention recognized that in the FLA and LSA, a processing temperature (peak temperature) is high and the temperature of the wafer is increased and decreased in an extremely short period of time, resulting in a higher stress subjected on the wafer to cause cracking of the wafer. Thus, the inventors sought a mean to provide a wafer that can withstand the high stress. In the RTA, the cracking of the wafer has been prevented by stopping the extension of slippage by an oxygen precipitate in the wafer. At first, it was recognized that the method was nearly ineffective in FLA and LSA, since the temperature condition in the above-mentioned heat treatment was too harsh and stringent. Furthermore, in the FLA and LSA, generation states of stress in the wafer differ depending on the heating methods corresponding to the heat treatments. Accordingly, it was recognized that a prevention measure specialized to these heating methods was needed.

Thus, to prevent the cracking of the wafer in these heat treatment condition, the relationship between the presence or absence of a defect (crack) in the surface of the wafer and occurrence of cracking was investigated.

As a result, the inventors found that in terms of occurrence of cracking, there was a constant relationship among the size of the defect (crack) existing on the front (back) surface of the wafer, the location of the defect, and the stress generated in the inside of the vicinity of the surface (back surface) of the wafer corresponding to an FLA heat treatment condition, as described in Examples afterward.

A method of manufacturing a silicon wafer of the present invention is a method of manufacturing a silicon wafer comprising the steps of: preparing a wafer, in which a single crystal silicon ingot is sliced to obtain a silicon wafer and the surface of the silicon wafer is surface-treated; setting stress, in which the stress S (MPa) subjected on the wafer prepared in the step of preparing a wafer is set; inspecting, in which a defect on a front or back surface of the wafer is inspected; and determining, in which the wafer is evaluated if the wafer satisfies a criterion indicated by a formula (A) below, and a wafer satisfying the criterion is sorted out as a qualified wafer and a wafer not satisfying the criterion as an unqualified wafer.

$$\text{Stress } S \times \text{Size of defect } C \leq 3500 \text{ (MPa·μm)} \tag{A}$$

C: Size of defect on the front or back side surface of the silicon wafer (μm)

In the method of manufacturing a silicon wafer of the present invention, when the stress S depends on a heat treatment, a temperature of the heat treatment may be 1100° C. or up to the melting point of silicon, and heat treating time may be 1μ second to 100 m seconds.

In the method of manufacturing a silicon wafer of the present invention, a wafer having 10 or less of LPD whose size is 2 μm or more on the back side surface of the wafer may be evaluated satisfying the criterion indicated by the formula (A) above in the step of determining.

In the method of manufacturing a silicon wafer of the present invention, a silicon wafer sorted out as a wafer not satisfying the criterion indicated by the formula (A) above may be surface-treated again in the step of preparing a wafer.

In the method of manufacturing a silicon wafer of the present invention, an oxygen concentration Oi of the silicon wafer may be set to $5 \times 10^{17}$ atoms/cm$^3$ to $20 \times 10^{17}$ atoms/cm$^3$ (Old-ASTM).

The silicon wafer of the present invention may be manufactured by the methods of manufacturing the silicon wafer described above.

The silicon wafer of the present invention is a silicon wafer that is mirror finished and subjected to a semiconductor device manufacturing process having a heat treatment process with conditions in which the highest temperature ranges from 1100° C. to the melting point of silicon and a processing time ranges from 1µ second to about 100 m seconds. In the silicon wafer of the present invention, when a stress generated at each point of the silicon wafer by the heat treatment is S (MPa) and a size of a defect in the back surface of the silicon wafer is C (µm), the size of the defect may be set to satisfy the following formula (A).

$$\text{Stress } S \times \text{Size of defect } C \leq 3500 \text{ (MPa·µm)} \quad (A)$$

In the wafer of the present invention, it is more preferable that the number of LPDs having a size of 2 µm or more in the back surface of the silicon wafer is 10 or less.

In the wafer of the present invention, the oxygen concentration Oi of the silicon wafer may range from $5 \times 10^{17}$ atoms/cm$^3$ to $20 \times 10^{17}$ atoms/cm$^3$ (Old-ASTM).

In addition, the method of manufacturing a silicon wafer of the present invention is a method of manufacturing a silicon wafer in which a silicon wafer that is mirror finished and subjected to a semiconductor device manufacturing process having a heat treatment process with conditions in which the highest temperature ranges from 1100° C. to the melting point of silicon and a processing time ranges from 1µ second to about 100 m seconds. In the method of manufacturing a silicon wafer of the present invention, when a stress generated at each point of the silicon wafer by the heat treatment is S (MPa) and a size of a defect in the back surface of the silicon wafer is C (µm), the size of the defect can be set to satisfy the following formula (A).

$$\text{Stress } S \times \text{Size of defect } C \leq 3500 \text{ (MPa·µm)} \quad (A)$$

Further, in the method of manufacturing a silicon wafer of the present invention, when the heat treatment is performed, a means in which the number of LPDs having a size of 2 µm or more in the back surface of the silicon wafer is 10 or less may be used.

The silicon wafer of the present invention is a silicon wafer that is mirror finished and subjected to a semiconductor device manufacturing process having a heat treatment process with conditions in which the highest temperature ranges from 1100° C. to the melting point of silicon and a processing time ranges from 1 g second to about 100 m seconds. In the method of manufacturing a silicon wafer of the present invention, by setting the size of the defect to satisfy the formula (A), when a stress generated at each point of the silicon wafer by the heat treatment is S (MPa) and a size of a defect in the back surface of the silicon wafer is C (µm), a silicon wafer capable of preventing occurrence of the cracking in a semiconductor device manufacturing process having a heat treatment process, such as FLA, in which a generated stress is high compared to the RTA, can be provided.

$$\text{Stress } S \times \text{Size of defect } C \leq 3500 \text{ (MPa·µm)} \quad (A)$$

Figure 3:
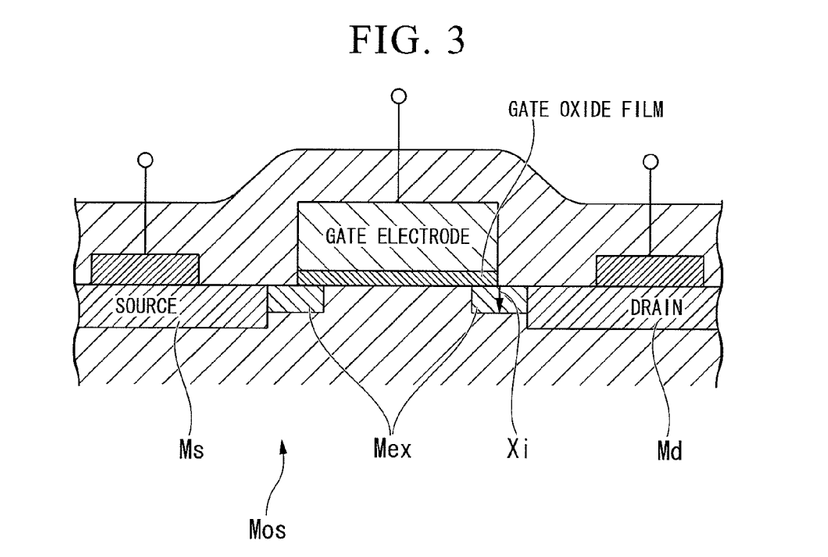
FIG. 3 is a schematic cross-sectional view showing a MOS FET.
Figure 4:
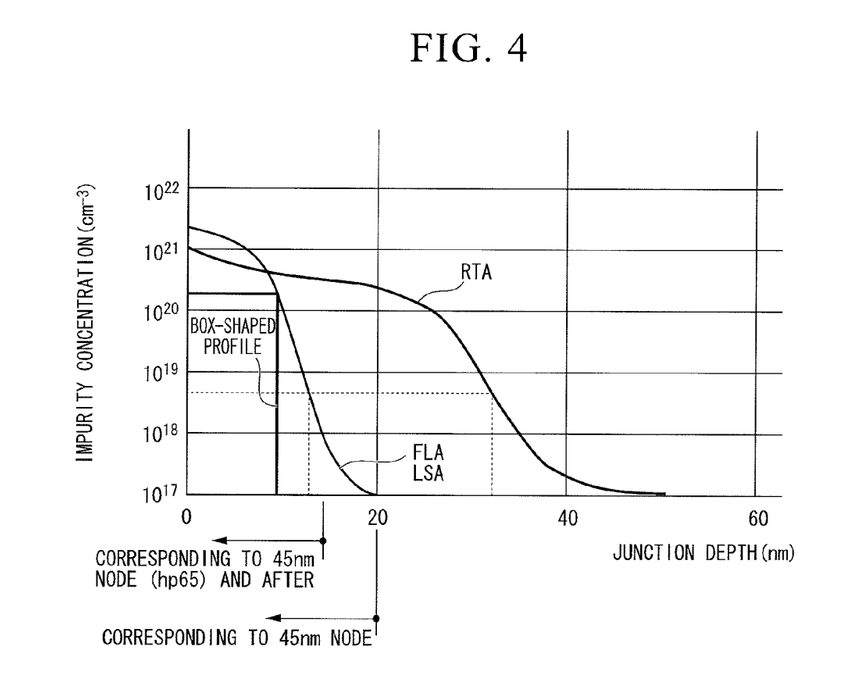
FIG. 4 is a graph showing a box-shaped impurity profile in a relationship between an impurity concentration and a junction depth.

At a 45 nm node (hp65), annealing for a shorter time at a higher temperature compared to the conventional RTA is performed as an annealing process for a MOS FET. This is because it is necessary to achieve a box-shaped impurity profile as shown in FIG. 4 in a very shallow junction Mex that is an impurity diffusion region adjacent to a source Ms and a drain Md of a MOS FET indicated by a reference numeral Mos and having a shallow depth (junction depth) Xi from a substrate surface on the order of 20 nm, as shown in FIG. 3, i.e., uniformity of an impurity concentration in the very shallow junction Mex region, and a steep change state at a boundary. Thus, this is because implanted impurities are sufficiently activated by a high heating temperature to reduce resistance, unnecessary impurity diffusion is suppressed by a short heating time, and deactivation of the activated impurities is avoided.

Thus, in order to achieve a junction depth Xi smaller than 20 nm required in a 45 nm node (hp65), the FLA, LSA or the like is performed. In the FLA, the wafer is heated to an initial temperature of 400° C. to 600° C., the entire surface of the wafer is irradiated with light using a short wavelength light, for example, from a Xe flash lamp, and only a surface of the wafer is rapidly heated or cooled to 900° C. to 1350° C. in a heat treatment time in millisecond units. In the LSA, a wafer is rapidly heated to a temperature from 1100° C. to the melting point of silicon and rapidly cooled so that a heat treatment time is from µ second to m second by heating the wafer to an initial temperature of 400° C. to 600° C. on a hot plate and irradiating the wafer with a continuous oscillation laser to spot-scan the wafer.

In the FLA and LSA, processing conditions capable of obtaining maintenance of an impurity concentration distribution characteristic in a very shallow junction region indicated by Mex in FIG. 3, reduction of junction leakage, suppression of gate leakage, reduction of parasitic resistances in a source and a drain, and suppression depletion of a gate are selected.

In the LSA in which a wafer is locally heated using laser irradiation, it is difficult to accurately calculate an internal stress from local heating and laser scanning, i.e., movement of a heating position. However, in the FLA in which the entire wafer is simultaneously heated, it is possible to calculate the internal stress as described above. In such a condition, an internal stress generated in the wafer upon heat treatment reaches a level of 50 to 150 MPa.

However, in the LSA, a temperature difference is generated even around an irradiated laser spot, that is, in a wafer in-plane direction, in addition to a thickness direction of the wafer, while in the FLA in which a wafer is uniformly heated in a wafer in-plane direction, a temperature difference is mainly generated in a thickness direction of the wafer. Accordingly, an internal stress generated in the wafer in heat treatment in the FLA may be considered smaller, compared to that of the LSA.

Accordingly, in the FLA, it is necessary to prevent occurrence of the cracking with different conditions and means from the LSA.

Further, the inventors have noticed that in the LSA, effects of cracks in the vicinity of an edge greatly contribute to occurrence of cracking, i.e., cracks are easily generated when a laser irradiation position in the vicinity of an edge of the wafer. Meanwhile, it was noticed that in the FLA, presence of cracks in the vicinity of the central portion of the wafer has a great influence on occurrence of the cracking.

The inventors have found a measure to prevent the occurrence of the cracking on the wafer in the silicon wafer manufacturing process.

In the present invention, by limiting the number of LPD whose size is 2 µm or more to 10 or less in the back surface of the silicon wafer, the wafer satisfying the condition represented by the formula (A) can be manufactured. Because of this, a state of the back surface allowing to prevent occurrence of the cracking can be obtained. The state of the back surface is specified depending on the rapid heating and cooling heat treatment process, such as the FLA, in the semiconductor device manufacturing process to which the silicon wafer is subjected.

Figure 9:
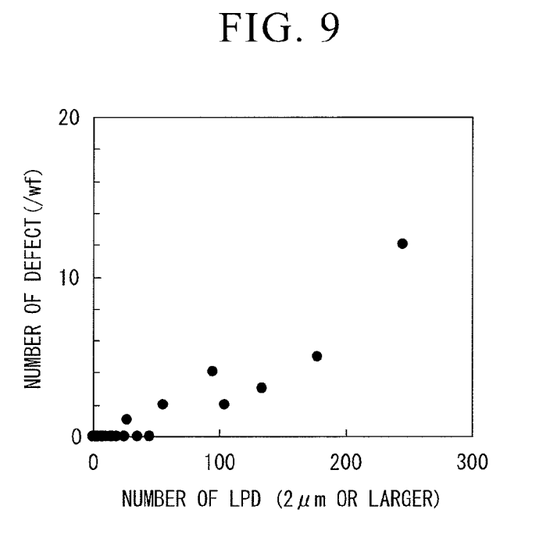
FIG. 9 is a graph showing a relationship between the number of defects in a back surface and the number of LPDs having a size of 2 μm or more.

As shown in FIG. 9, it is clear that the number of defects (cracks) measured by a laser microscope or a dark-field microscope based on a confocal optical system would increase if the number of LPDs whose size is 2 μm or more increased in the back surface. In the FIG. 9 graph, a dot corresponds to data of the back surface of one wafer. That is, it is possible to estimate the number of defects in the back surface of the wafer by measuring the LPDs. In this case, measuring the LPDs according to a defect presence condition (including sizes and positions of defects) satisfying the above-described cracking prevention conditions enables the cracking prevention conditions to be used instead.

The laser microscope or the dark-field microscope based on a confocal optical system serves to focus a laser light on a sample, irradiate with a small spot, re-focus a reflective light of the laser light on pinholes arranged on the entire surface of an optical receiver, and detect an amount of light passing through the pinholes. Specifically, for example, Magics available from LaserTec Corporation can be used.

In the present invention, an oxygen concentration Oi of the silicon wafer can range from $5 \times 10^{17}$ to $20 \times 10^{17}$ atoms/cm³ (Old-ASTM).

In the method of manufacturing a silicon wafer of the present invention, the silicon wafer is mirror finished and then applied to a semiconductor device manufacturing process with a heat treatment process performed under conditions where the maximum temperature is higher than 1100° C. and lower than the melting point of silicon and the treatment time is 1μ seconds to 100 m seconds. The size of defects is set to satisfy the formula (A) below, wherein the symbol S represents a stress force (MPa) generated at each point on the silicon wafer in the heat treatment process described above and the symbol represents the size of defect C (μm) on the back side of the wafer.

Stress $S$×Size of defect $C \leq 3500$ (MPa·μm) (A)

By setting the size of the defect C to satisfy the formula (A), a wafer having cracking resistance can be provided even if a wafer with cracks, which are liable to cause cracking, is subjected to the FLA treatment. The cracks liable to cause cracking are ones formed at the center region whose radius is to 2/3 the outer radius R of the wafer.

Further, the inventors found that reducing the formation of the defects at the center region whose radius is to 2/3 the outer radius R of the wafer is important to improve the resistance against the cracking occurring in the FLA process. Thus, a condition, in which the center region whose radius is to 2/3 the outer radius R of the wafer is not handled in a wafer handling can be selected. There are higher possibility that the defects are formed in the wafer handling, such as a loading process and a heat treatment process in the wafer manufacturing process. In addition, possible occurrence of the cracking in the FLA treatment can be reduced by not handling the region subjected to an increased stress center, which is region whose radius is to 2/3 the outer radius R of the wafer, in the silicon wafer manufacturing process after a double-sided mirror finishing process capable of removing defects in the back surface of the wafer.

Further, in the present invention, a condition, in which there are 10 or fewer LPDs having a size of 2 μm or more in the back surface of the silicon wafer in the heat treatment described above, can be selected. A silicon wafer is subjected rapid heating and cooling in the FLA during the device manufacturing process. By selecting the condition, a wafer having a back surface state enabling to prevent the cracking occurring in the FLA can be obtained.

The method of manufacturing a silicon wafer of the present invention is a method of manufacturing a silicon wafer comprising the steps of: preparing a wafer, in which a single crystal silicon ingot is sliced to obtain a silicon wafer and the surface of the silicon wafer is surface-treated; setting stress, in which the stress S (MPa) subjected on the wafer prepared in the step of preparing a wafer is set; inspecting, in which a defect on a front or back surface of the wafer is inspected; and determining, in which the wafer is evaluated if the wafer satisfies a criterion indicated by a formula (A) below, and a wafer satisfying the criterion is sorted out as a qualified wafer and a wafer not satisfying the criterion as an unqualified wafer.

Stress $S$×Size of defect $C \leq 3500$ (MPa·μm) (A)

C: Size of defect on the front or back side surface of the silicon wafer (μm)

By having the configuration described above, a passing status can be determined base on the result of the step of inspecting, taking out wafers not satisfying the criterion. Because of this, a silicon wafer having a back surface state enabling to prevent the cracking occurring in the FLA heat treatment in the semiconductor manufacturing process can be provided.

Accordingly, a silicon wafer free of cracking can be manufactured even if the wafer is subjected to a harsh heat treatment enabling to activate electrically the implanted impurities or to remove the crystal defects formed by implantation of impurities in the anneal treatment after implantation of impurities into the source and drain diffusion regions, in a condition capable of obtaining a state close to the rectangular impurity profile.

Further, when the stress S depends on a heat treatment, by controlling the temperature of the heat treatment from 1100° C. to the melting point of silicon, and heat treating time from 1μ second to 100 m seconds, occurrence of cracking can be prevented, even in the FLA, in which there is higher possibility of occurrence of cracking due to defects on the central region of the wafer while maintaining electrical activation of the impurities and the rectangular impurity profile.

Further, when it is determined in the step of inspection that the number of LPDs having a size of 2 μm or more in a back surface of a silicon wafer is 10 or less, a wafer capable of crack prevention can be identified by determining in the determination process that the silicon wafer satisfies the criterion (A).

In the present invention, by surface-treating again the silicon wafer sorted out as a wafer not satisfying the criterion indicated by the formula (A) above in the step of preparing a wafer, a wafer satisfying the criterion can be obtained from ones sorted out at first. Further, in this case, it is preferable that the second surface-treating in the step of the preparation is a polishing treatment on the back surface of the wafer. The polishing treatment is the finish polishing. By having the polishing process having the polish margin ranging from 1 to 3 μm on the back surface of the silicon wafer, defects introduced in the step of preparing a wafer can be removed. Thus, the interfering effect of the defects introduced in the step of preparing a wafer can be nullified, and the cracking occurring in the FLA process can be prevented.

In the wafer of the present invention, the oxygen concentration Oi of the silicon wafer can be set to a range of $5 \times 10^{17}$ to $20 \times 10^{17}$ atoms/cm³ (Old-ASTM).

The silicon wafer of the present invention can be manufactured by the methods of manufacturing a silicon wafer described above.

Advantageous Effects of Invention

According to a silicon wafer provided by the present invention, occurrence of cracking from the center portion of the wafer can be prevented, even if the wafer is subjected to a heat treatment process, such as the FLA or the like, generating an extremely strong stress compared to the RTA.

BEST MODE FOR CARRYING OUT THE INVENTION

Figure 1:
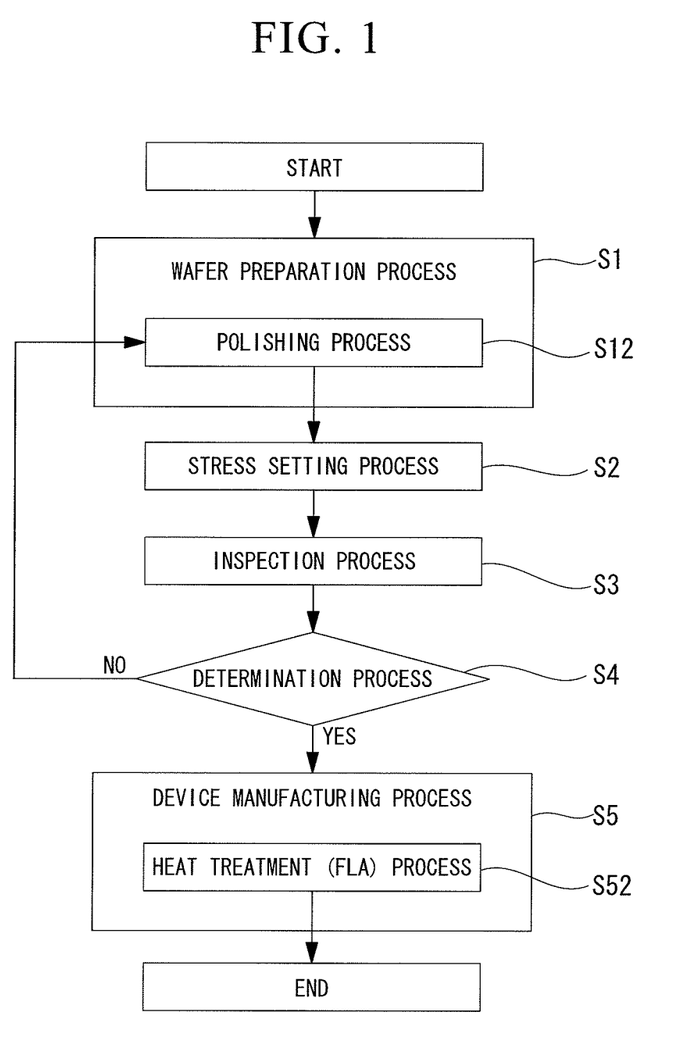
FIG. 1 is a flowchart showing a method of manufacturing a silicon wafer according to a first embodiment of the present invention.

Hereinafter, a silicon wafer and a method of manufacturing the same according to a first embodiment of the present invention will be described based on the accompanying drawings. FIG. 1 is a flowchart showing the method of manufacturing a silicon wafer in the present embodiment.

The method of manufacturing a silicon wafer in the present embodiment is a method of manufacturing a silicon wafer in which a silicon wafer is mirror finished. Then, the mirror finished wafer is subjected to a semiconductor device manufacturing process having a rapid heating and cooling heat treatment process. The maximum temperature of the rapid heating and cooling heat treatment process ranges from 1100° C. to the melting point of silicon. Duration time of the heat treatment process ranges from 1μ second to 100 m seconds or from 1μ second to 10 m seconds. As shown in FIG. 1, the method of manufacturing a silicon wafer in the present embodiment includes a wafer preparation process S1 including a polishing process S12, a stress setting process S2, an inspection process S3, a determination process S4, and a device manufacturing process S5 including a heat treatment process S52 such as FLA.

The wafer preparation process S1 shown in FIG. 1 is a process of preparing a silicon wafer, in which a silicon single crystal is pulled from silicon melt using a CZ (Czochralski) method, the pulled single crystal is sliced to obtain a wafer, the wafer is surface-treated by chamfering, grinding, polishing, washing, and the like. The wafer preparation process S1 includes a polishing process S12 as a finishing process.

In pulling of the single crystal in the wafer preparation process S1, an oxygen concentration Oi of the silicon wafer is set to $5 \times 10^{17}$ to $20 \times 10^{17}$ atoms/cm$^3$ (Old-ASTM).

Figure 6:
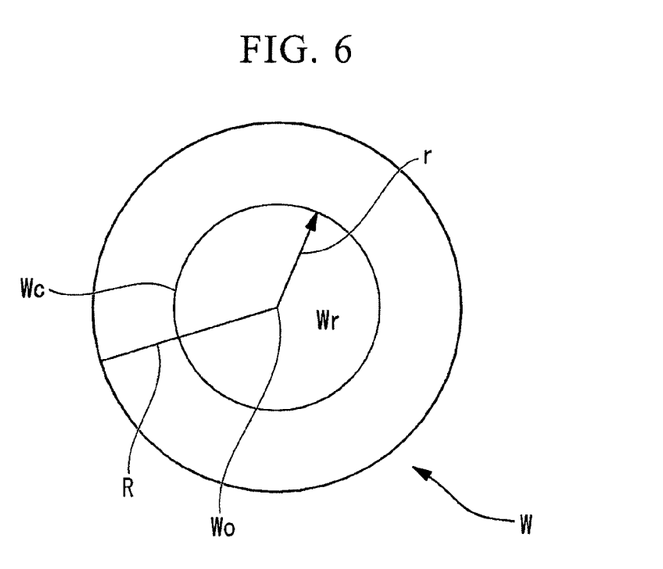
FIG. 6 is a plan view showing a silicon wafer according to the first embodiment of the present invention.

In the stress setting process S2 shown in FIG. 1, a stress generated in a surface layer of the wafer and a surface state of the back surface of the wafer are set. The surface state of the back surface of the wafer is determined based on the stress generated in a surface layer of the wafer. The stress is generated in the surface of the wafer by the rapid heating and cooling heat treatment process S52, such as the FLA. The heat treatment process S52 is a process included in the device manufacturing process S5, which is a post-process and to which the silicon wafer prepared in the wafer preparation process S1 is subjected. As specific conditions for the heat treatment that the mirror finished silicon wafer is subjected to, the maximum temperature of the rapid heating and cooling heat treatment process S52 ranges from 1100° C. to the melting point of silicon. Duration time of the heat treatment process S52 ranges from 1μ second to 100 m seconds. In the stress setting process S2, the surface state of the center portion of the back surface of the wafer is set, allowing to prevent occurrence of cracking. In the surface state of the back surface of the wafer, specifically, the defect having a size of 10 μm or more, which causes cracking in the heat treatment process S52, is eliminated from the center portion of the wafer We shown in FIG. 6 based on a condition described below. The center portion of the wafer We is the portion having a distance r from a center Wo toward the outside of the wafer in a radial direction in the back surface Wr of the silicon wafer W, as shown in FIG. 6. This distance r is set so that a ratio of the distance r to a radius size of the wafer indicated by a reference numeral R in FIG. 6 ranges from 0 to 2/3.

Here, a silicon wafer having a diameter size of 300 mm to 450 mm can be used.

In the present embodiment, in the device manufacturing process S5, the heat treatment process S52 is performed under conditions that electrical activation of implanted impurities in an annealing process after the impurities are implanted into a source and drain diffusion region Mex shown in FIG. 3 and removal of crystal defects caused by the impurity implantation be simultaneously achieved.

Figure 5:
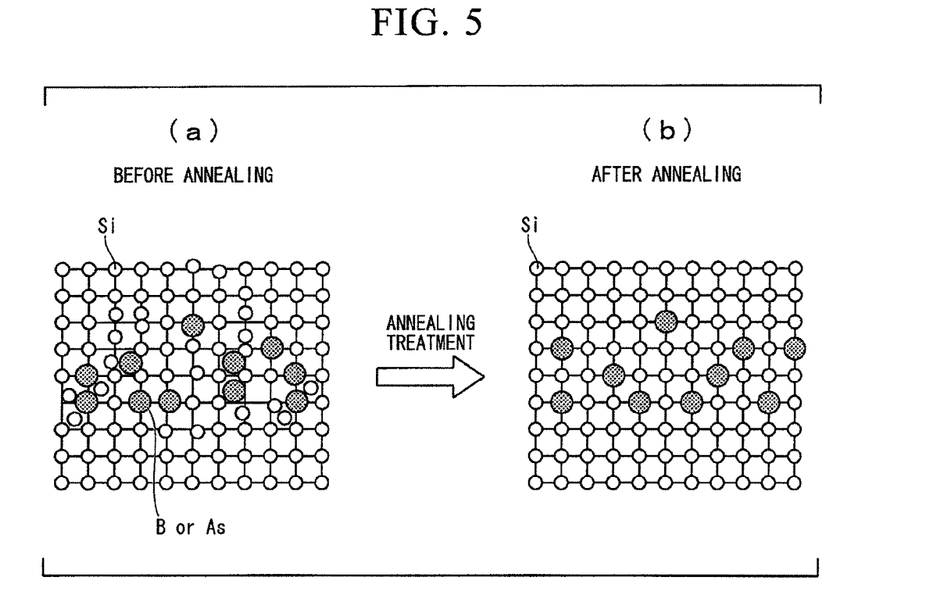
FIG. 5 is a schematic diagram showing a behavior of silicon atoms and impurity caused by annealing.

The electrical activation refers to a transition from a state of low electrical conductivity in which the impurities implanted by ion implantation are electrically inactivated only as the impurities are usually randomly present in the Si crystal as shown in FIG. 5(a), to a state of high electrical conductivity as the impurities are moved to a position of a crystal lattice point as shown in FIG. 5(b) by thermal energy applied through annealing and electrically activated.

The removal of the crystal defects caused by the impurity implantation refers to a transition from a state shown in FIG. 5(a) to a state shown in FIG. 5(b). In the state shown in FIG. 5(a), the impurities are implanted to the single-crystal silicon with Si atoms arranged regularly. By the implantation energy, lattice defects are generated in the regularly arranged Si atoms, disturbing the arrangement of Si atoms. In the state shown in FIG. 5(b), the silicon atoms are rearranged by applying heat in the annealing treatment, and crystal defects, which cause leak current, are removed.

In the impurity activation of the former, the distance that the impurity atoms have to travel to reach to a Si lattice point between atoms (lattices) is short. Thus, the period of time took for the activation is short. However, a high temperature, such as the peak temperature is over 1000° C., is needed. Thus, in the impurity activation of the former, a high temperature is needed, and its time constant is low.

On the other hand, in the rearrangement of the Si single-crystal, its time constant is high. The reason for this is that the distance that atoms need to travel in the rearrangement is long when their regular arrangement is broken, and it takes long for recrystallization. Thus, for this removal of crystal defects, a long annealing treatment at low temperature is needed.

As explained above, having a proper condition for the heat treatment process S52 is hard to obtain, since the two phenomena with different time constants have to be regulated simultaneously in the heat treatment process S52. In the case where the priority is placed on the impurity activation and the temperature is set to be high, the duration of the treatment time has to be short to minimize diffusion of the impurities. Because of the short treatment time, the crystal defects are not removed sufficiently. Hence, the leak current of MOS FET is increased. In the case where the priority is placed on the removal of crystal defects and the treatment time is set to be long, the defects of the crystal are recovered and its crystallinity is recovered. However, diffusion of the impurities is enhanced and occurrence of the short-channel effect is increased.

Thus, in the heat treatment process S52, two contradicting requirements described above need to be satisfied and two thermal phenomena with different time constants need to be controlled to form an extremely shallow junction Mex having a high impurity density and a shallow diffusion depth. In the condition, a proper wafer condition has to be selected to adjust the heat treatment, since occurrence of wafer cracking is extremely high in the heat treatment condition compared to one in the conventional RTA.

As a stress state of the back surface in the wafer stress setting process S2, a size of defect is set for the product S×C to satisfy a formula (A) below, wherein the symbol S and C represent the maximum stress strength S (MPa) generated in the vicinity of the wafer surface and the size of defect C (μm) on the center portion of the back surface of the wafer, respectively.

$$S \times C \leq 3500 \text{ (MPa·μm)} \tag{A}$$

As explained below in Examples, the treatment temperature (peak temperature) is higher than 1100° C. and lower than the melting point of silicon. The treatment time ranges 1μ second to 100 m seconds. To adjust to the conditions described above, heating energy supplied from the wafer surface to the interior is set to 20 to 30 J/cm², preferably, 22 to 26 J/cm² for each unit area.

That is, for a wafer having a diameter of 300 mm, in Table 1, when the heating energy (processing temperature) is 20 J/cm², a state in which there are no defects having a size of about 40 to 50 μm in a range in which a distance from a center in a radial direction is no more than 10/300 of the radius size of the wafer, a state in which there are no defects having a size of about 60 to 70 μm in a range in which the distance from the center in the radial direction is no more than 120/300 of the radius size of the wafer, and a state in which there are no defects having a size of about 115 to 125 μm in a range in which the distance from the center in the radial direction is no more than 120/300 of the radius size of the wafer are set, as will be described later. In Table 2, when the heating energy (processing temperature) is 22 J/cm², a state in which there are no defects having a size of about 40 to 50 μm in a range in which the distance from the center in the radial direction is no more than 100/300 of the radius size of the wafer, a state in which there are no defects having a size of about 60 to 70 μm in a range in which the distance from the center in the radial direction is no more than 120/300 of the radius size of the wafer, and a state in which there are no defects having a size of about 115 to 125 μm in a range in which the distance from the center in the radial direction is no more than 120/300 of the radius size of the wafer are set. In Table 3, when the heating energy (processing temperature) is 24 J/cm², a state in which there are no defects having a size of about 40 to 50 μm in a range in which the distance from the center in the radial direction is no more than 120/300 of the radius size of the wafer, a state in which there are no defects having a size of about 60 to 70 μm in a range in which the distance from the center in the radial direction is no more than 120/300 of the radius size of the wafer, and a state in which there are no defects having a size of about 115 to 125 μm in a range in which the distance from the center in the radial direction is no more than 120/300 of the radius size of the wafer are set. In Table 4, when the heating energy (processing temperature) is 26 J/cm², a state in which there are no defects having a size of about 40 to 50 μm in a range in which the distance from the center in the radial direction is no more than 120/300 of the radius size of the wafer, a state in which there are no defects having a size of about 60 to 70 μm in a range in which the distance from the center in the radial direction is no more than 120/300 of the radius size of the wafer, and a state in which there are no defects having a size of about 115 to 125 μm in a range in which the distance from the center in the radial direction is no more than 130/300 of the radius size of the wafer are set.

When the heating energy (processing temperature) is 20 J/cm², the measured surface temperature of the wafer is about 1050° C. or less than 1100° C., but a relationship among the generated internal stress, sizes of defects, and presence or absence of defects does not depend on a surface temperature state of the wafer and has no change from the above-described relationship. Accordingly, a heat treatment condition that a maximum value of the internal stress generated even in a low temperature state become greater than 95 MPa is included in the present invention. The maximum value of the generated internal stress may be considered to be generated in the central portion of the wafer.

When the generated stress is a compressive stress, the wafer is not cracked. Accordingly, all settings of stress in edges of the wafer can be excluded.

The inspection process S3 shown in FIG. 1 is to inspect the defects in end and back surfaces of the silicon wafer. It is inspected whether the number of LPDs having a size of 2 μm or more is 10 or less when a ratio of a distance r from the center toward the outside of the wafer in the radial direction in the back surface of the silicon wafer and the diameter size R of the wafer ranges from 0 to 2/3. Specifically, an inspection method, such as a surface inspection machine (e.g., SP-1 available from KLA-Tencor) using a laser or an image inspection method using a CCD camera, may be used.

In the determination process S4 shown in FIG. 1, it is determined that a wafer satisfying the criterion that defects satisfying (A) described above are excluded passes, and a wafer not satisfying the criterion does not pass at the region where the ratio of the distance r from the center toward the outside of the wafer in the radial direction in the back surface of the silicon wafer and the diameter size R of the wafer ranges from 0 to 2/3 as a result of the inspection process S3.

If it is determined in the determination process S4 that the wafer does not pass, the process returns to the polishing process S12 of the wafer preparation process S1, in which defects in the back and end surfaces of the wafer are removed to satisfy the criterion for recovery, and proceeds to the inspection process S3 and the determination process S4 again.

If it is determined in the determination process S4 that the wafer passes, the silicon wafer is supplied to the device manufacturing process S5.

In the device manufacturing process S5, a process necessary to make a device using a 45 nm node (hp65) in the silicon wafer is performed. The device manufacturing process S5 has the heat treatment process S52 such as FLA.

Figure 7:
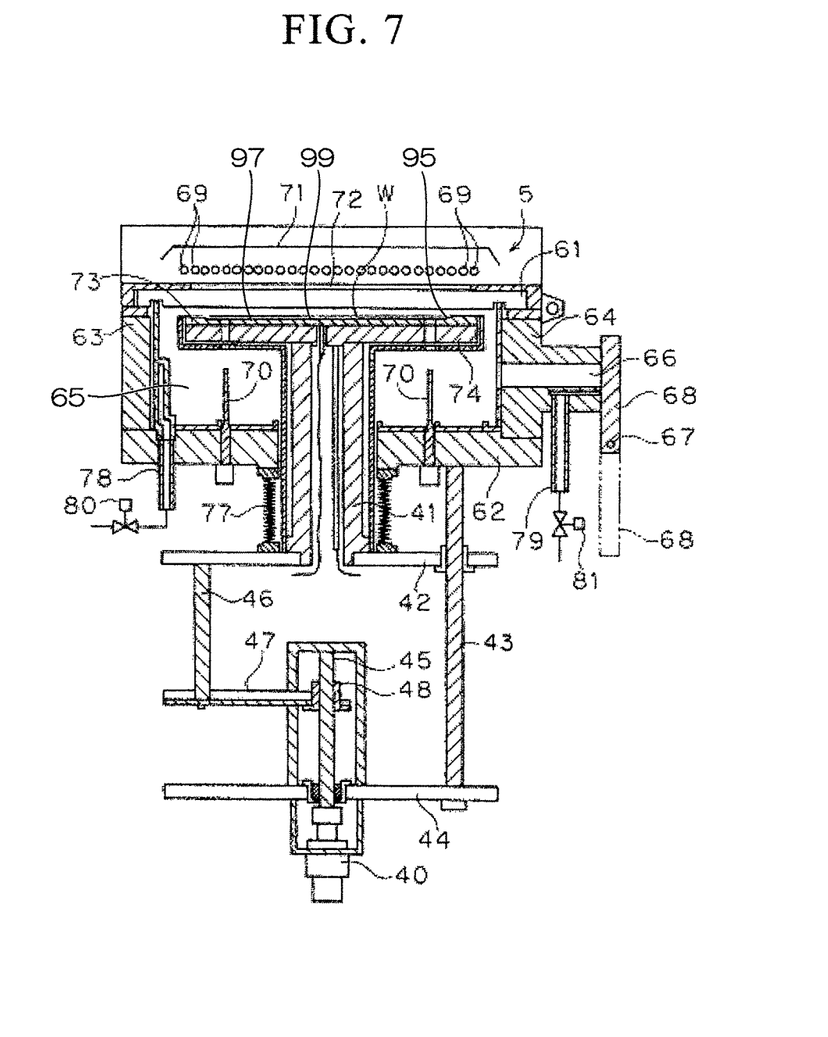
FIG. 7 is a schematic diagram showing an FLA apparatus.

In the heat treatment process S52 shown in FIG. 1, flash lamp annealing is performed with a heat treatment apparatus shown in FIG. 7. The FLA apparatus is capable of heating to about 1350° C. by irradiation in the order of μ second to m second. This heat treatment apparatus is an apparatus for performing heat treatment on a substrate such as a silicon wafer using flash from a xenon flash lamp.

The heat treatment apparatus includes a light transmitting plate 61, a bottom plate 62, and a pair of side plates 63 and 64. In the heat treatment apparatus, a chamber 65 to accommodate a semiconductor wafer (silicon wafer) W within and to perform heat treatment on the wafer W. The light transmitting plate 61 constituting an upper portion of the chamber 65 is formed of, for example, a material having infrared transparency, such as quartz. The transmitting plate 61 functions as a chamber window that transmits light output from the light source 5 and guides the light to the inside of the chamber 65. On the bottom plate 62, which constitutes the chamber 65, a support pin 70 is provided in a standing state. The support pin 70 penetrates through a susceptor 73 and a heating plate 74, which will be described later, and supports the semiconductor wafer W from its back surface.

Also, an opening portion 66 for loading and unloading the semiconductor wafer W is formed in the side plate 64 constituting the chamber 65. The opening portion 66 can be opened or closed by a gate valve 68 that rotates about an axis 67. The semiconductor wafer W is loaded into the chamber 65 by a transfer robot, which is not shown, in a state in which the opening portion 66 is opened. When heat treatment is performed on the semiconductor wafer W inside the chamber 65, the opening portion 66 is closed by the gate valve 68.

The chamber 65 is provided below the light source 5. The light source 5 includes a plurality (in the present embodiment, 27) of xenon flash lamps 69 (hereinafter referred to simply as "flash lamps 69") and a reflector 71. The plurality of flash lamps 69 are rod-shaped lamps each having a long cylindrical shape, and are disposed to be in parallel with one another so that respective longitudinal directions become horizontal directions. The reflector 71 is disposed above the plurality of flash lamps 69 to cover all the flash lamps 69.

The xenon flash lamp 69 includes a glass tube containing xenon gas sealed therein and having an anode and a cathode disposed at both ends and connected to a capacitor, and a trigger electrode wound around an outer local portion of the glass tube. Since the xenon gas is an electrical insulator, electricity does not flow inside the glass tube in a normal state. However, when a high voltage is applied to the trigger electrode and insulation is destroyed, electricity accumulated in the capacitor instantaneously flows inside the glass tube. The xenon gas is heated by Joule heat at this time and light is emitted. In the xenon flash lamp 69, since previously accumulated electrostatic energy is converted into a very short light pulse on the order of 0.1 m seconds to 10 m seconds, it is possible to irradiate very strong light, compared to a continuously turned-on light source.

A light diffuser 72 is disposed between the light source 5 and the light transmitting plate 61. A light diffuser obtained by performing a light diffusion process on a surface of a quartz glass as an infrared transparent material is used as the light diffuser 72.

A part of light emitted from the flash lamp 69 directly passes through the light diffuser 72 and the light transmitting plate 61, being directed toward the chamber 65. Also, the other part of the light emitted from the flash lamp 69 is first reflected by the reflector 71, and then the reflected light passes through the light diffuser 72 and the light transmitting plate 61, being directed toward the chamber 65.

The heating plate 74 and the susceptor 73 are provided in the chamber 65. The susceptor 73 is bonded to an upper surface of the heating plate 74. The heating plate 74 and the susceptor 73 constitute a holding means for holding the semiconductor wafer W in a substantially horizontal position in the chamber 65.

The heating plate 74 is for preheating (assist heating) the semiconductor wafer W. The heating plate 74 is formed of aluminum nitride and has a configuration in which a heater and a sensor for controlling the heater are housed therein. Meanwhile, the susceptor 73 positions and holds the semiconductor wafer W and diffuses thermal energy from the heating plate 74 so that the semiconductor wafer W is uniformly preheated. A material having relatively low thermal conductivity, such as aluminum nitride or quartz, is used as a material of the susceptor 73. The susceptor 73 will be described in detail later.

The susceptor 73 and the heating plate 74 are configured to move up or down between a loading and unloading position of the semiconductor wafer W and a heat treatment position of the semiconductor wafer W when the susceptor 73 and the heating plate 74 are driven by the motor 40.

That is, the heating plate 74 is coupled to a movable plate 42 through a cylindrical body 41. The movable plate 42 is guided by a guide member 43 attached to the bottom plate 62 of the chamber 65 such that the movable plate 42 can move up or down. Further, a fixed plate 44 is fixed to a lower end of the guide member 43, and the motor 40 for rotating a ball screw 45 is disposed in a central portion of the fixed plate 44. The ball screw 45 is screwed with a nut 48 that is coupled with the movable plate 42 via the coupling members 46 and 47. Thereby, the susceptor 73 and the heating plate 74 can move up or down between the loading and unloading position of the semiconductor wafer W and the heat treatment position of the semiconductor wafer W when the susceptor 73 and the heating plate 74 are driven by the motor 40.

The loading and unloading position of the semiconductor wafer W is a position to which the susceptor 73 and the heating plate 74 have moved down so that the semiconductor wafer W loaded from the opening portion 66 using a transfer robot, which is not shown, is placed on the support pin 70 or the semiconductor wafer W placed on the support pin 70 is unloaded from the opening portion 66. In this state, an upper end of the support pin 70 passes through through-holes formed in the susceptor 73 and the heating plate 74 and protrudes upward from the surface of the susceptor 73.

Meanwhile, the heat treatment position of the semiconductor wafer W shown in FIG. 7 is a position to which the susceptor 73 and the heating plate 74 move upward from the upper end of the support pin 70 in order to perform heat treatment on the semiconductor wafer W. When the susceptor 73 and the heating plate 74 move up from the loading and unloading position to the heat treatment position, the semiconductor wafer W placed on the support pin 70 is received by the susceptor 73, a lower surface of the semiconductor wafer W is supported on the surface of the susceptor 73, and the semiconductor wafer W is moved up and held in a horizontal posture at a position close to the light transmitting plate 61 in the chamber 65. Conversely, when the susceptor 73 and the heating plate 74 move down from the heat treatment position to the loading and unloading position, the semiconductor wafer W supported by the susceptor 73 is passed to the support pin 70.

In a state in which the susceptor 73 and the heating plate 74 supporting the semiconductor wafer W have moved up to the heat treatment position, the light transmitting plate 61 is located between the semiconductor wafer W held by the susceptor 73 and the heating plate 74 and the light source 5. In this case, a distance between the susceptor 73 and the light source 5 may be adjusted to any value by controlling the rotation amount of the motor 40.

Further, a flexible bellows 77 for maintaining the chamber 65 in an airtight state by surrounding the cylindrical body 41 is disposed between the bottom plate 62 of the chamber 65 and the movable plate 42. The bellows 77 contracts when the susceptor 73 and the heating plate 74 move up to the heat treatment position and extends when the susceptor 73 and the heating plate 74 move down to the loading and unloading position, to block between atmosphere in the chamber 65 and external atmosphere.

An introduction passage 78 communicatively coupled to an opening and closing valve 80 is formed in the side plate 63 opposing the opening portion 66 in the chamber 65. The introduction passage 78 introduces gas necessary for processing in the chamber 65, such as an inactivated nitrogen gas. Meanwhile, an exhaust passage 79 communicatively coupled to an opening and closing valve 81 is formed in the opening portion 66 in the side plate 64. The exhaust passage 79 is for exhausting gas in the chamber 65 and is coupled to an exhaust means, which is not shown, through the opening and closing valve 81.

Next, an FLA heat treatment operation in the heat treatment apparatus will be described. The semiconductor wafer W to be processed by the heat treatment apparatus is an ion-implanted semiconductor wafer.

In the heat treatment apparatus, the semiconductor wafer W is loaded through the opening portion 66 by a transfer robot, which is not shown, in a state in which the susceptor 73 and the heating plate 74 are disposed at the loading and unloading position of the semiconductor wafer W, and is placed on the support pin 70. When the semiconductor wafer W has been loaded, the opening portion 66 is closed by the gate valve 68. Then, the susceptor 73 and the heating plate 74 move up to the heat treatment position of the semiconductor wafer W shown in FIG. 7 when the susceptor 73 and the heating plate 74 are driven by the motor 40, and hold the semiconductor wafer W in a horizontal position. Further, the opening and closing valve 80 and the opening and closing valve 81 are opened to form airflow for nitrogen gas in the chamber 65.

Here, the semiconductor wafer W placed on the support pin 70 is received by the susceptor 73 when the susceptor 73 and the heating plate 74 move up. In this case, a thin air layer is formed between the susceptor 73 and the semiconductor wafer W for a few seconds after the semiconductor wafer W moves from the support pin 70 to the susceptor 73, and the semiconductor wafer W is slightly floated from the susceptor 73 by the air layer. In such a state, a phenomenon which the semiconductor wafer W is slid inside the concave portion 97 and an end of the wafer is bounced off by a tapered surface 95 due to an unspecified reason (e.g., a slight slope) is repeated for a few seconds. Then, the air layer soon escapes and the semiconductor wafer W is stably held in the concave portion 97 of the susceptor 73. That is, the slightly floated semiconductor wafer W is positioned by the tapered surface 95, such that the semiconductor wafer W is held on a bottom position of the concave portion 97, i.e., a placing surface 99, without a particular positioning pin. The placing surface 99 has a slightly greater diameter than the semiconductor wafer W. Usually, since the semiconductor wafer W is eccentrically positioned and held on the placing surface 99, the semiconductor wafer W is stably held on the placing surface 99, with a point of a rim end of the semiconductor wafer W contacting the tapered surface 95.

The susceptor 73 and the heating plate 74 are preheated to a given temperature by a heater embedded in the heating plate 74. Thereby, the semiconductor wafer W contacts the susceptor 73, which is in a heating state, and preheated in a state in which the susceptor 73 and the heating plate 74 move up to the heat treatment position of the semiconductor wafer W, such that the temperature of the semiconductor wafer W gradually increases.

In this state, the semiconductor wafer W is continuously heated by the susceptor 73. When the temperature of the semiconductor wafer W increases, it is always monitored whether the surface temperature of the semiconductor wafer W reaches a preheating temperature T1 by a temperature sensor, which is not shown.

The preheating temperature T1 ranges, for example, from 200° C. to 600° C. Even when the semiconductor wafer W is heated to the preheating temperature T1, ions implanted into the semiconductor wafer W are not diffused.

If the surface temperature of the semiconductor wafer W soon reaches the preheating temperature T1, the flash lamp 69 is turned on to perform flash heating. A turn-on time of the flash lamp 69 in the flash heating process is on the order of 0.1 m seconds to 10 m seconds.

Thus, since previously accumulated electrostatic energy is converted into such a very short light pulse in the flash lamp 69, a very strong flash is irradiated.

Such flash heating enables the surface temperature of the semiconductor wafer W to instantaneously reach a temperature T2. The temperature T2 is a temperature of about 1000° C. to 1100° C. required for an ionic activation process of the semiconductor wafer W. As the surface of the semiconductor wafer W is heated to such a processing temperature T2, the ions implanted into the semiconductor wafer W are activated.

In this case, since the surface temperature of the semiconductor wafer W is heated to the processing temperature T2 in a very short time in the order of 0.1 m seconds to 10 m seconds, the activation of the ions in the semiconductor wafer W is completed in a short time. Accordingly, the ions implanted into the semiconductor wafer W are not diffused such that a phenomenon that a profile of the ions implanted into the semiconductor wafer W is not maintained can be prevented from occurring. Since the time required for ionic activation is much shorter than that required for ion diffusion, the ionic activation is completed in such a short time that the diffusion on the order of 0.1 to 10 m seconds does not occur.

Further, since the surface temperature of the semiconductor wafer W is heated to the preheating temperature T1 of about 200° C. to 600° C. using the heating plate 74 before the semiconductor wafer W is heated by turning the flash lamp 69 on, the semiconductor wafer W can be rapidly heated to the processing temperature T2 of about 1000° C. to 1100° C. by the flash lamp 69.

After the flash heating process is terminated, the susceptor 73 and the heating plate 74 move down to the loading and unloading position of the semiconductor wafer W shown in FIG. 7 due to being driven by the motor 40, and the closed opening portion 66 is opened by the gate valve 68. As the susceptor 73 and the heating plate 74 move down, the semiconductor wafer W is passed from the susceptor 73 to the support pin 70. The semiconductor wafer W placed on the support pin 70 is unloaded by the transfer robot that is not shown. By doing so, a series of heat treatment operations are completed.

For the silicon wafer in the present embodiment, only the silicon wafer determined to pass in the determination process S4 is sent to the device manufacture process S5, such that, although no stress or crack generation mechanism is thoroughly explained, a silicon wafer capable of preventing crack generation even in a scanning laser irradiation type heat treatment process S52, which includes the FLA using an FLA apparatus as described above, can be provided.

Thus, the implanted impurities can be sufficiently activated by high heating temperature to reduce resistance, and simultaneously, unnecessary impurity diffusion can be suppressed by a short heating time. In addition, crack generation can be suppressed even in a heat treatment capable of realizing a box-shaped impurity profile as shown in FIG. 4 while avoiding deactivation of the activated impurities.

At the same time, a silicon wafer capable of preventing the occurrence of cracking can be provided, even if the wafer is subjected to a harsh condition equivalent to the FLA. If a wafer was exposed to such a harsh condition, it is impossible to prevent the cracking by a conventional methods performed for suppressing or preventing extension of the slip dislocation, such as controlling the concentration of the dissolved oxygen Oi, size and density of an oxygen precipitate, concentrations of carbon and nitrogen as an additive, and concentration of phosphorous (P) as a phosphorous getter.

Further, in the polishing process S12, the back surface of the silicon wafer is polished from 1 µm to 3 µm, such that even when the silicon wafer is determined as not passing in the determination process S4 or the defects are introduced in the wafer preparation process S1, the defects can be removed to exclude their effects, and wafer crack generation in the LSA process can be prevented.

Figure 8:
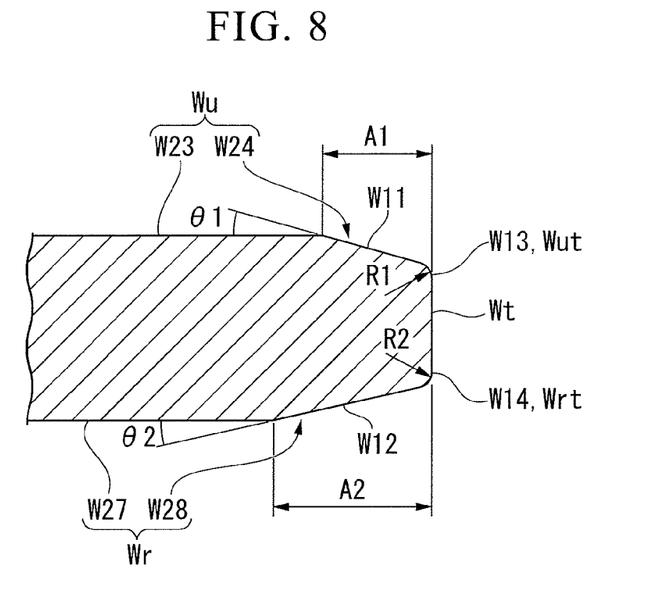
FIG. 8 is an enlarged cross-sectional view showing an edge of a silicon wafer according to the present invention.

As shown in FIG. 8, a main surface W23 that is a flat surface, and a surface-side chamfer portion W24 formed in a rim portion are provided in a surface Wu of a wafer. Further, a main surface W27 that is a flat surface, and a back surface-side chamfer portion W28 formed in a rim portion are provided in a back surface Wr. A width A1 of the surface-side chamfer portion W24 from a rim end Wt toward the interior in a radial direction of the wafer is narrower than a width A2 of the back surface-side chamfer portion W28 from a rim end Wt toward the interior in a radial direction of the wafer. The width A1 of the surface-side chamfer portion W24 preferably ranges from 50 µm to 200 µm. Further, the width A2 of the back surface-side chamfer portion W28 preferably ranges from 200 µm to 300 µm.

Further, the surface-side chamfer portion W24 has a first inclined surface W11 inclined with respect to the main surface W23 of the surface Wu, and the back surface-side chamfer portion W28 has a second inclined surface W12 inclined with respect to the main surface W27 of the back surface Wr. An inclination angle θ1 of the first inclined surface W11 preferably ranges from 10° to 50°, and an inclination angle θ2 of the second inclined surface W12 preferably ranges from 10° to 30°. Preferably, θ1 is not more than θ2.

Further, a first curved surface W13 connecting the first inclined surface W11 to the rim end Wt is provided in an outermost peripheral portion Wut of the surface between the first inclined surface W11 and the rim end Wt. Further, a second curved surface W14 connecting the second inclined surface W12 to the rim end Wt is provided in an outermost peripheral portion Wrt of the back surface between the second inclined surface W12 and the rim end Wt. A curvature radius R1 of the first curved surface W13 preferably ranges from 80 µm to 250 µm, and a curvature radius R2 of the second curved surface W14 preferably ranges from 100 µm to 300 µm.

This structure of the end portion can reduce generation of defects when the wafer is handled. In the present embodiment, it is possible to prevent crack generation in the FLA with stringent conditions by setting a condition for the rim portion of the wafer, in addition to the state of the central portion of the wafer causing cracks in the FLA.

Hereinafter, a silicon wafer and a method of manufacturing the same according to a second embodiment of the present invention will be described based on the accompanying drawings.

Figure 2:
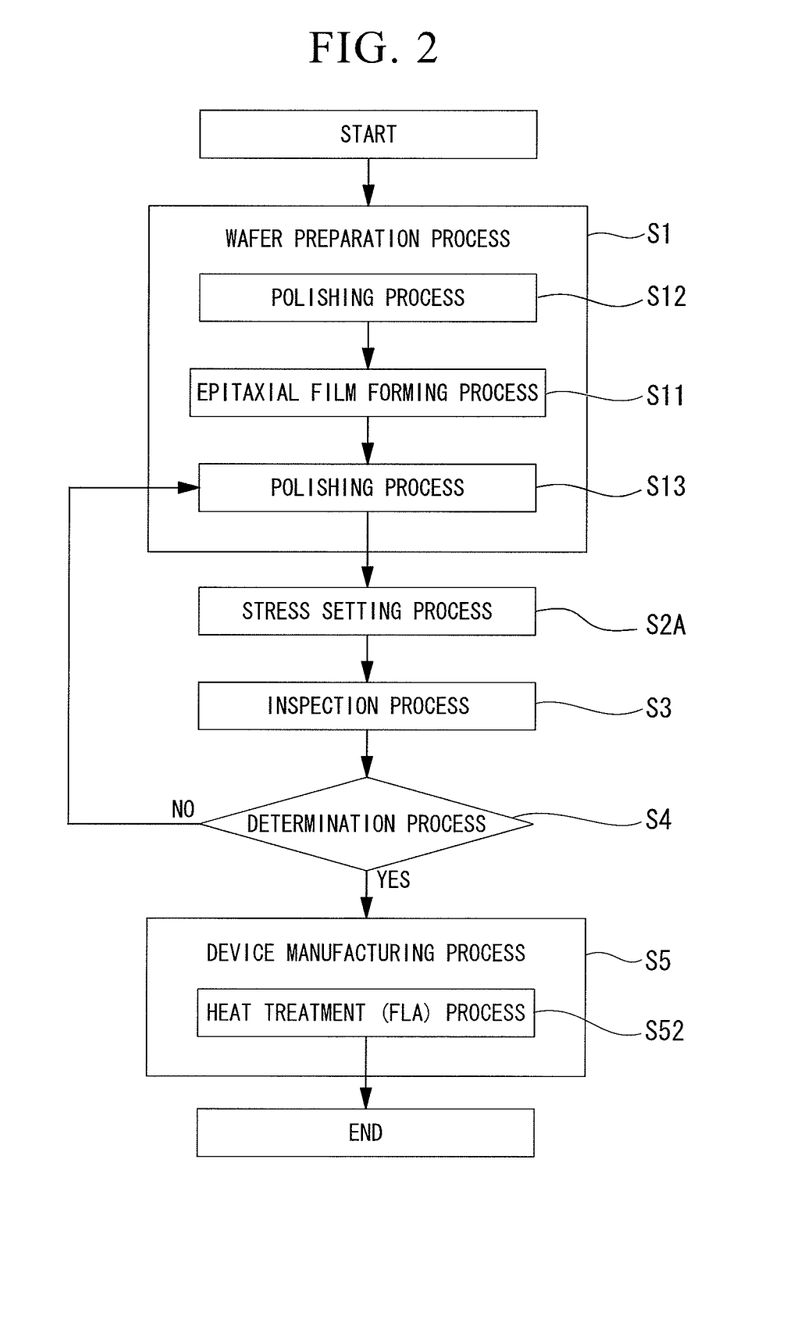
FIG. 2 is a flowchart showing a method of manufacturing a silicon wafer according to a second embodiment of the present invention.

FIG. 2 is a flowchart showing a method of manufacturing a silicon wafer in the second embodiment. The second embodiment differs from the first embodiment shown in FIG. 1 in an epitaxial layer formation. A description of the same components as those in the first embodiment will be omitted by assigning the same reference numerals to the components.

In the present embodiment, a wafer preparation process S1 includes an epitaxial layer formation process S11 and a subsequent polishing process S13, as shown in FIG. 2.

In the epitaxial layer formation process S11 shown in FIG. 2, an epitaxial layer is formed on a wafer surface. For example, a p/p⁻ type can be obtained. This refers to a wafer in which a p⁻ type epitaxial layer is stacked on a p⁻ type wafer. Here, a concentration of boron (B) corresponds to a resistivity of 0.1 to 100 Ωcm for a p⁻ type, and corresponds to a resistivity of 0.1 Ωcm to 100 Ωcm for a p type.

The epitaxial layer formation process S11 in the present embodiment is performed by a vapor deposition apparatus after the polishing process S12 is performed. Even in this case, it is important to prevent defects from being generated during handling

EMBODIMENT

Hereinafter, an embodiment according to the present invention will be described.

EXPERIMENTAL EXAMPLE 1

A (100) wafer was prepared from a silicon single-crystal ingot having a diameter of 300 mm pulled so that an oxygen concentration Oi was $6 \times 10^{17}$ atoms/cm³ (Old-ASTM), by slicing and double-sided polishing (DSP).

Vickers indentations that become defects were introduced to a back surface of the silicon wafer with different loads using a diamond indenter based on a Vickers indentation method, with the Vickers indentations introduced at one place for one wafer.

A defect introduction position is from the vicinity of the center in the back surface of the wafer to an outer edge of the back surface (~3 mm). The position is shown as a distance in Tables 1 to 4.

Sizes of defects generated from the introduced defects (Vickers indentations) were measured using an optical microscope and are shown in Table 1. After the defects were introduced, a wafer crack test was conducted by performing an annealing process under different Xe lamp irradiation energy conditions using an FLA (Flash Lamp Anneal) furnace capable of millisecond annealing. An initial wafer temperature was 500° C. The results are shown in Tables 1 to 4. In the tables, the heating energy corresponds to the highest arrival temperature near the wafer surface obtained through light absorption calculation and finite element calculation for each irradiation condition.

TABLE 1

| Defect State | | FLA Conditions | | | |
| --- | --- | --- | --- | --- | --- |
| Defect Introduction Position Distance (mm) from Outermost Periphery | Size C (μm) of Introduced Defect | Heating Energy (Processing Temperature) | Maximum Stress S Mpa | S × C MPa · μm | Crack Test Result |
| 0-10 | 45.5 | 20 J/cm² | −76.4 | −3476.2 | ○ |
| 20-30 | 41.8 | | 16.3 | 681.34 | ○ |
| 35-45 | 47.8 | | 52.9 | 2528.62 | ○ |
| 50-60 | 46.2 | | 73.3 | 3386.46 | ○ |
| 140-150 | 41.9 | | 99 | 4148.1 | X |
| 0-10 | 65.3 | 20 J/cm² | −76.4 | −4988.92 | ○ |
| 20-30 | 67.3 | | 16.3 | 1096.99 | ○ |
| 35-45 | 68.9 | | 52.9 | 3644.81 | X |
| 50-60 | 64.2 | | 73.3 | 4705.86 | X |
| 140-150 | 66.6 | | 99 | 6593.4 | X |
| 0-10 | 121.9 | 20 J/cm² | −76.4 | −9313.16 | ○ |
| 20-30 | 115.4 | | 16.3 | 1881.02 | ○ |
| 35-45 | 120.5 | | 52.9 | 6374.45 | X |
| 50-60 | 118.2 | | 73.3 | 8664.06 | X |
| 140-150 | 121.6 | | 99 | 12038.4 | X |

TABLE 2

| Defect State | | FLA Conditions | | | |
| --- | --- | --- | --- | --- | --- |
| Defect Introduction Position Distance (mm) from Outermost Periphery | Size C (μm) of Introduced Defect | Heating Energy (Processing Temperature) | Maximum Stress S Mpa | S × C MPa · μm | Crack Test Result |
| 0-10 | 45.5 | 22 J/cm² | −81.7 | −3717.35 | ○ |
| 20-30 | 41.8 | | 21.43 | 895.774 | ○ |
| 35-45 | 47.8 | | 61.03 | 2917.234 | ○ |
| 50-60 | 46.2 | | 82.6 | 3816.12 | X |
| 140-150 | 41.9 | | 108.9 | 4562.91 | X |
| 0-10 | 65.3 | 22 J/cm² | −81.7 | −5335.01 | ○ |
| 20-30 | 67.3 | | 21.43 | 1442.239 | ○ |
| 35-45 | 68.9 | | 61.03 | 4204.967 | X |
| 50-60 | 64.2 | | 82.6 | 5302.92 | X |
| 140-150 | 66.6 | | 108.9 | 7252.74 | X |
| 0-10 | 121.9 | 22 J/cm² | −81.7 | −9959.23 | ○ |
| 20-30 | 115.4 | | 21.43 | 2473.022 | ○ |
| 35-45 | 120.5 | | 61.03 | 7354.115 | X |
| 50-60 | 118.2 | | 82.6 | 9763.32 | X |
| 140-150 | 121.6 | | 108.9 | 13242.24 | X |

TABLE 3

| Defect State | | FLA Conditions | | | |
| --- | --- | --- | --- | --- | --- |
| Defect Introduction Position Distance (mm) from Outermost Periphery | Size C (μm) of Introduced Defect | Heating Energy (Processing Temperature) | Maximum Stress S Mpa | S × C MPa · μm | Crack Test Result |
| 0-10 | 45.5 | 24 J/cm² | −87 | −3958.5 | ○ |
| 20-30 | 41.8 | | 26.6 | 1111.88 | ○ |
| 35-45 | 47.8 | | 69 | 3298.2 | X |
| 50-60 | 46.2 | | 91.7 | 4236.54 | X |
| 140-150 | 41.9 | | 118.4 | 4960.96 | X |
| 0-10 | 65.3 | 24 J/cm² | −87 | −5681.1 | ○ |
| 20-30 | 67.3 | | 26.6 | 1790.18 | ○ |
| 35-45 | 68.9 | | 69 | 4754.1 | X |
| 50-60 | 64.2 | | 91.7 | 5887.14 | X |
| 140-150 | 66.6 | | 118.4 | 7885.44 | X |
| 0-10 | 121.9 | 24 J/cm² | −87 | −10605.3 | ○ |
| 20-30 | 115.4 | | 26.6 | 3069.64 | ○ |
| 35-45 | 120.5 | | 69 | 8314.5 | X |
| 50-60 | 118.2 | | 91.7 | 10838.94 | X |
| 140-150 | 121.6 | | 118.4 | 14397.44 | X |

TABLE 4

| Defect State | | FLA Conditions | | | |
|---|---|---|---|---|---|
| Defect Introduction Position Distance (mm) from Outermost Periphery | Size C (μm) of Introduced Defect | Heating Energy (Processing Temperature) | Maximum Stress S Mpa | S × C MPa · μm | Crack Test Result |
| 0-10 | 45.5 | 26 J/cm² | −92 | −4186 | ○ |
| 20-30 | 41.8 | | 32 | 1337.6 | ○ |
| 35-45 | 47.8 | | 77.1 | 3685.38 | X |
| 50-60 | 46.2 | | 101 | 4666.2 | X |
| 140-150 | 41.9 | | 127.8 | 5354.82 | X |
| 0-10 | 65.3 | 26 J/cm² | −92 | −6007.6 | ○ |
| 20-30 | 67.3 | | 32 | 2153.6 | ○ |
| 35-45 | 68.9 | | 77.1 | 5312.19 | X |
| 50-60 | 64.2 | | 101 | 6484.2 | X |
| 140-150 | 66.6 | | 127.8 | 8511.48 | X |
| 0-10 | 121.9 | 26 J/cm² | −92 | −11214.8 | ○ |
| 20-30 | 115.4 | | 32 | 3692.8 | X |
| 35-45 | 120.5 | | 77.1 | 9290.55 | X |
| 50-60 | 118.2 | | 101 | 11938.2 | X |
| 140-150 | 121.6 | | 127.8 | 15540.48 | X |

A negative stress value indicates a compressive stress force and a positive stress value indicates a tensile stress. A crack test result o indicates no crack generation, and × indicates crack generation.

It is evident from these results that cracks are generated when the highest arrival temperature in the wafer surface is 1100° C. (corresponding to heating energy of 22 J/cm²) or more, cracks are generated when positions of the defects range from a center to a radius ratio of 2/3, cracks are generated when defects having a crack size of 40 μm or more are present in a region no more than a radius ratio of 2/3, and cracks are generated when stress S×defect size C exceeds 3500 (MPa·μm).

It is evident from these results that it is necessary to avoid introduction of defects not satisfying the above-described condition of Equation (A), particularly, to a region We of no more than a radius ratio of 2/3 to have resistance to cracks generated in the FLA process. There is a risk of defects being introduced when the wafer is handled in a loading process or a heat treatment process in the wafer processing process. Here, it is possible to reduce a risk of cracks in the FLA process by not handling a region more than a radius ratio of 2/3 after a double-sided mirror polishing process in which the defects are removed.

EXPERIMENTAL EXAMPLE 2

Similarly, a relationship between the number of back surface LPDs and a crack generation rate was measured.

Cracks or defects in the back surface of the wafer can be detected as LPDs using a laser light scattering type particle counter (e.g., SP1 or SP2 available from KLA-Tencor) as a means for measuring the cracks or defects in the back surface of the wafer. This experimental example is an example in which a crack test was conducted for 300 mm wafers having a different number of back surface LPDs using an FLA furnace. The crack generation rate is a crack generation rate when 100 wafers were processed at each level.

The result is shown in Table 5.

TABLE 5

| Number of Back Surface LPDs (2 μm or more) (Range from Center of Wafer to 2R/3) | FLA Heat Treatment Conditions (Crack Generation Rate) | | |
|---|---|---|---|
| | 20 J/cm₂ | 21 J/cm² | 24 J/cm² |
| 0~5 | 0% | 0% | 0% |
| 6~10 | 0% | 0% | 0% |
| 11~20 | 0% | 0% | 1% |
| 20~30 | 0% | 1% | 3% |

It can be seen from the result that the inspection process can be performed based on a wafer having cracking resistance by using the number of LPDs as a criterion.

INDUSTRIAL AVAILABILITY

The present invention relates to a method of manufacturing a silicon wafer, which is suitable for use in a silicon wafer subjected to heat treatment in which high internal stress is generated. According to the method of manufacturing a silicon wafer of the present invention, it is possible to provide a wafer having cracking resistance even if it is subjected to a millisecond annealing by the FLA annealing treatment.

DESCRIPTION OF REFERENCE NUMERALS

W: Silicon wafer
Wr: Back surface
Wo: Center

The invention claimed is:
1. A method of manufacturing a silicon wafer that is subjected to a flash lamp annealing process, the method comprising the steps of: preparing a wafer, in which a single crystal silicon ingot is sliced to obtain a silicon wafer and a surface of the silicon wafer is surface-treated; setting stress, in which the stress S (MPa) subjected on the wafer prepared in the step of preparing a the wafer during the flash lamp annealing process is set before the flash lamp annealing process; inspecting, in which a defect on a front or back surface of the wafer is inspected; and determining, in which the wafer is evaluated if the wafer satisfies a criterion indicated by a formula (A) below, and a wafer satisfying the criterion is sorted out as a qualified wafer and a wafer not satisfying the criterion as an unqualified wafer, wherein the flash lamp annealing process is performed in a condition where a temperature is from 1100° C. to the melting point of silicon and a lapse time is from 1μ second to 100 m seconds; Stress S×Size of defect C 3500 (MPa·μm) (A) C: Size of defect on the front or back side surface of the silicon wafer (μm).

2. The method of manufacturing a silicon wafer according to claim 1, wherein a wafer having 10 or less of light point defects (LPDs) whose size is 2 μm or more on the back side surface of the wafer is evaluated satisfying the criterion indicated by the formula (A) above in the step of determining.

3. The method of manufacturing a silicon wafer according to claim 2, wherein a silicon wafer sorted out as a wafer not satisfying the criterion indicated by the formula (A) above is surface-treated again in the preparing the wafer.

4. The method of manufacturing a silicon wafer according to claim 2, wherein an oxygen concentration Oi of the silicon wafer is set to $5 \times 10^{17}$ atoms/cm$^3$ to $20 \times 10^{17}$ atoms/cm$^3$ (Old-ASTM).

5. The method of manufacturing a silicon wafer according to claim 1, wherein a silicon wafer sorted out as a wafer not satisfying the criterion indicated by the formula (A) above is surface-treated again in the step of preparing a the wafer.

6. The method of manufacturing a silicon wafer according to claim 5, wherein an oxygen concentration Oi of the silicon wafer is set to $5 \times 10^{17}$ atoms/cm$^3$ to $20 \times 10^{17}$ atoms/cm$^3$ (Old-ASTM).

7. The method of manufacturing a silicon wafer according to claim 1, wherein an oxygen concentration Oi of the silicon wafer is set to $5 \times 10^{17}$ atoms/cm$^3$ to $20 \times 10^{17}$ atoms/cm$^3$ (Old-ASTM).

8. The method of manufacturing a silicon wafer according to claim 3, wherein an oxygen concentration Oi of the silicon wafer is set to $5 \times 10^{17}$ atoms/cm3 to $20 \times 10^{17}$ atoms/cm3 (Old-ASTM).

* * * * *

UNITED STATES PATENT AND TRADEMARK OFFICE
CERTIFICATE OF CORRECTION

| | |
|---|---|
| PATENT NO. | : 8,765,492 B2 |
| APPLICATION NO. | : 13/258702 |
| DATED | : July 1, 2014 |
| INVENTOR(S) | : T. Ono et al. |

It is certified that error appears in the above-identified patent and that said Letters Patent is hereby corrected as shown below:

In The Claims

At column 20, lines 59-60 (claim 1, lines 6-7), "in the step of preparing a the wafer" should be -- in the preparing the wafer --.

At column 22, line 4 (claim 5, line 4), "in the step of preparing a the wafer" should be -- in the preparing the wafer --.

Signed and Sealed this
Twenty-fourth Day of March, 2015

Michelle K. Lee
*Director of the United States Patent and Trademark Office*